United States Patent [19]

Pai et al.

[11] Patent Number: 5,648,194
[45] Date of Patent: Jul. 15, 1997

[54] PHOTORESIST COMPOSITION COMPRISING AN ALKALI-SOLUBLE RESIN, A QUINONE DIAZIDE COMPOUND AND A VINYL ETHER

[75] Inventors: Daniel Y. Pai, Millbury; Robert E. Hawkins, Upton, both of Mass.

[73] Assignee: Shipley Company, L.L.C., Marlborough, Mass.

[21] Appl. No.: 510,709

[22] Filed: Aug. 3, 1995

[51] Int. Cl.⁶ .......................... G03F 7/023; G03F 7/028
[52] U.S. Cl. .................. 430/165; 430/191; 430/192; 430/193; 430/281.2; 430/288.1
[58] Field of Search ..................... 430/191, 192, 430/265, 281, 286, 193

[56] References Cited

U.S. PATENT DOCUMENTS

| | | | |
|---|---|---|---|
| 5,364,738 | 11/1994 | Kondo et al. | 430/281 |
| 5,403,695 | 4/1995 | Hayase et al. | 430/191 |
| 5,527,656 | 6/1996 | Imai et al. | 430/288.1 |

FOREIGN PATENT DOCUMENTS

| | | |
|---|---|---|
| 0 520 642 | 12/1992 | European Pat. Off. . |
| 0 536 690 | 4/1993 | European Pat. Off. . |
| 92-20014 | 11/1992 | WIPO . |

*Primary Examiner*—John S. Y. Chu
*Attorney, Agent, or Firm*—Robert L. Goldberg

[57] ABSTRACT

A photoresist composition comprising an alkali soluble resin, an o-naphthoquinone diazide sulfonic acid ester photoactive compound, and a vinyl ether compound. The o-naphthoquinone diazide sulfonic acid ester is replaced in part with the vinyl ether composition to decrease the concentration of the photoactive compound while increasing the photospeed of the composition.

16 Claims, No Drawings

PHOTORESIST COMPOSITION COMPRISING AN ALKALI-SOLUBLE RESIN, A QUINONE DIAZIDE COMPOUND AND A VINYL ETHER

BACKGROUND OF THE INVENTION

I. Introduction

This invention relates to positive-working photoresist compositions. More particularly, this invention relates to photoresist compositions containing o-quinone diazide sulfonic acid ester photoactive compounds (PACs). The photoresists of the invention are characterized by a reduced PAC concentration and increased photospeed.

II. Description of the Prior Art

Photoresist compositions are well known in the art and described in numerous publications including DeForest, *Photoresist Materials and Processes*, McGraw-Hill Book Company, New York, 1975. Photoresist coating compositions are applied from liquid solution or as a dry film. When coated onto a substrate and exposed to light of the proper wavelength, they are chemically altered in their solubility to certain solvents (developers). Two types are known. The negative-acting resist is initially a mixture which is soluble in its developer, but following exposure to activating radiation, becomes insoluble in developer thereby defining a latent image. Positive-acting resists work in the opposite fashion, light exposure making the resist soluble in developer.

Positive-working photoresists are more expensive than negative-working photoresists but are capable of providing superior image resolution. The greater expense of the positive working photoresist is due primarily to the cost of the PAC used to formulate the photoresist. However, notwithstanding the higher cost of the positive photoresist, such materials are in substantial commercial use due to superior image resolution relative to the negative acting photoresists. For example, positive-working photoresists using o-quinone diazide sulfonic acid ester PACs can be developed to yield relief images having line widths of one micron or less. In addition, considering the cross section of a photoresist image, the channels formed in the resist by development have square corners and sidewalls with only minimal taper.

The positive-working photoresists typically comprise a light-sensitive component in a film-forming alkali soluble thermoplastic polymer binder. The light-sensitive compounds or PACs most frequently used are esters formed from o-quinone diazide sulfonic acids. These esters are well known in the art and are described by DeForest, supra, pages 47–55, incorporated herein by reference. PACs, and the methods used to make the same, are all well documented in prior patents including German Pat. No. 865,140 granted Feb. 2, 1953 and U.S. Pat. Nos. 2,767,092; 3,046,110; 3,046,112; 3,046,119; 3,046,121; 3,046,122; and 3,106,465, all incorporated herein by reference. Additional PACs that have been used in the formulation of positive-acting photoresists are shown in U.S. Pat. No. 3,637,384, also incorporated herein by reference. These materials are formed by reaction of a suitable diazide of an aromatic sulfonyl chloride with an appropriate resin amine. Methods for the manufacture of these PACs and examples of the same are shown in U.S. Pat. No. 2,797,213, incorporated herein by reference. Other positive-working diazo compounds have been used for specific purposes. For example, a diazo compound used as a positive-working photoresist for deep UV lithography is Meldrum's diazo and its analogs as described by Clecak et al, *Technical Disclosure Bulletin*, Volume 24, Number 4, September 1981, IBM Corporation, pp. 1907 and 1908. An o-quinone diazide compound suitable for laser imaging is shown in U.S. Pat. No. 4,207,107. The aforesaid references are also incorporated herein by reference.

The resin binders most frequently used with the o-quinone diazide PACs in commercial practice are the alkali soluble phenol formaldehyde resins known as the novolak resins. Photoresists using such polymers are illustrated in U.K. Pat. No. 1,110,017, incorporated herein by reference. These materials are the product of reaction of a phenol with formaldehyde under conditions whereby a thermoplastic polymer is formed with a glass transition temperature of about 100° C. Novolaks with glass transition temperatures in excess of 100° C. are also known and exemplified in U.S. Pat. No. 5,266,440, which discloses novolak resins comprising the product resulting from the acid condensation of an aromatic aldehyde with a phenol resulting in resins having a molecular weight in excess of 1,500 Daltons and glass transition temperatures in excess of 125° C.

Another class of binders used with such photoresists are homopolymers and copolymers of vinyl phenol. Photoresists of this nature are disclosed in U.S. Pat. No. 3,869,292, supra.

In the prior art, the above-described positive resists using alkali soluble phenolic resins as a binder are most often used as masks to protect substrates from chemical etching in photo-engraving processes. For example, in a conventional process for the manufacture of a printed circuit board, a copper-clad substrate is coated with a layer of a positive-working photoresist, exposed to actinic radiation to form a latent circuit image in the photoresist coating, developed with a liquid developer to form a relief image and etched with a chemical etchant whereby unwanted copper is removed and copper protected by the photoresist mask is left behind in a circuit pattern. For the manufacture of printed circuit boards, the photoresist must possess chemical resistance, must adhere to the circuit board substrate, and for high density circuits, must be capable of fine-line image resolution.

Similar photoresists are also used in the fabrication of semiconductors. As in the manufacture of printed circuits, the photoresist is coated onto the surface of a semiconductor wafer and then imaged and developed. Following development, the wafer is typically etched with an etchant whereby the portions of the wafer bared by development of the photoresist are dissolved while the portions of the wafer coated with photoresist are protected, thereby defining a circuit pattern. For use in the manufacture of a semiconductor, the photoresist must possess resistance to chemical etchants, must adhere to the surface of the semiconductor wafer and must be capable of very fine-line image resolution.

As noted above, positive working photoresists are substantially more expensive than negative working photoresists due primarily to the cost of the PAC. This component is expensive and used in significant concentration. Though disclosed in the literature that o-quinone diazide PACSs may be used in amounts of only several percent of the total solids content of the photoresist, in fact, in commercial practice, it has been found that the PAC is required in amounts of at least about fifteen percent by weight to provide a photoresist coating suitable of providing a useful relief image. For this reason, it is well recognized in the art that it is be desirable to find a means for reducing the concentration of the naphthoquinone diazide sulfonic acid ester PAC component of the photoresist without loss of image resolution or photospeed.

SUMMARY OF THE INVENTION

The present invention is directed to a photoresist composition comprising an alkali soluble resin binder, a naphthoquinone diazide sulfonic acid ester PAC and a vinyl ether compound. The photoresist is characterized by a reduced PAC concentration and increased photospeed, both made possible by addition of the vinyl ether compound to the photoresist composition.

It is known that photoresist photospeed and image resolution are in large part directly correlated with PAC concentration—i.e., photospeed and resolution increase proportionately as PAC concentration increases. Therefore, it is an unexpected discovery of this invention that addition of a vinyl ether compound to a photoresist permits reduction in PAC concentration while image resolution is maintained and photospeed is increased rather decreased as would be expected from a reduction in PAC concentration. Moreover, it has been found that an increase in photospeed is achieved even when less than a molar equivalent of vinyl ether is substituted for the PAC. For example, photospeed is increased even when the molar ratio of vinyl ether substitution to PAC is 1 to 2.

Accordingly, it is an object of this invention to provide a photoresist composition of reduced cost and increased photospeed by decreasing the concentration of the o-quinone diazide sulfonic acid ester PAC and by addition of a vinyl ether to the composition.

DESCRIPTION OF THE PREFERRED EMBODIMENTS

The photoresists of this invention comprise an organic solution of an alkali soluble resin, a naphthoquinone diazide sulfonic acid ester PAC and a vinyl ether.

The alkali soluble resin component of the photoresist is typically a phenolic resin such as a novolak resin, polyvinyl phenol resin, styrene resin, etc. Procedures for the preparation of such resins well known in the art and disclosed in numerous publications including those identified above.

Novolak resins are the thermoplastic condensation products of a phenol and an aldehyde. Examples of suitable phenols for condensation with an aldehyde, especially formaldehyde, for the formation of novolak resins include phenol, m-cresol, o-cresol, p-cresol, 2,4-xylenol, 2,5-xylenol, 3,4-xylenol, 3,5-xylenol, and thymol. An acid catalyzed condensation reaction results in the formation of a suitable novolak resin which may vary in molecular weight from about 500 to 100,000 daltons. The preferred novolak resins conventionally used for the formation of photoresists are the cresol formaldehyde condensation products.

Poly(vinylphenol) resins are thermoplastic polymers that may be formed by block polymerization, emulsion polymerization or solution polymerization of the corresponding monomers in the presence of a cationic catalyst. Vinylphenols useful for the production of poly(vinylphenol) resins may be prepared, for example, by hydrolysis of commercially available coumarin or substituted coumarins, followed by decarboxylation of the resulting hydroxy cinnamic acids. Useful vinylphenols may also be prepared by dehydration of the corresponding hydroxy alkyl phenols or by decarboxylation of hydroxy cinamic acids resulting from the reaction of substituted or unsubstituted hydroxybenzaldehydes with malonic acid. Preferred poly(vinylphenol) resins prepared from such vinylphenols have a molecular weight range of from about 2,000 to about 100,000 daltons.

Other suitable phenolic resins include polystyrenes and copolymers of phenol and cyclic alcohols. The copolymer of a phenol and a cyclic alcohol may be formed by copolymerizing a phenol with a cyclohexanol or by hydrogenating a known phenolic resin. Details for the formation of such copolymers are disclosed in U.S. Pat. No. 5,258,257, incorporated herein by reference.

The PAC used in combination with the alkali-soluble resin is not critical. These compounds are the condensation products of typically a 1,2-naphthoquinonediazide sulfonic acid and an aromatic or aliphatic alcohol. Typical examples of the 1,2-naphthoquinone compound are 1,2-naphthoquinonediazide-4-sulfonic acid halide and 1,2-naphthoquinonediazide-5-sulfonic acid halide. Typical examples of alcohols are hydroquinone, resorcinol, 2,4-dihydroxybenzophenone, 2,3,4-trihydroxybenzophenone, 2,4,6-trihydroxy benzophenone, 2,3,4,4'-tetrahydroxybenzophenone, 2,2'4,4'-tetrahydroxybenzophenone, 2,3,4,2',4'-pentahydroxy benzophenone, 2,3,4,2',6'-pentahydroxy benzophenone, 2,3,4,3',4',5'-hexahydroxy benzophenone, 2,4,6,3',4',5'-hexahydroxy-5-chloro benzophenone, and 2,3,4,3',4',5'-hexahydroxy-5-benzoyl benzophenone, bis(3,4-dihydroxy phenyl) methane, 2,2-bis(2,4-dihydroxy phenyl) propane and 2,2-bis(2,3,4-trihydroxy phenyl) propane, bis(2,4-dihydroxyphenyl)methane, bis(2,3,4-trihydroxyphenyl) methane, 2,2-bis(2,4-dihydroxyphenyl)propane, 2,2-bis(2,3,4-trihydroxyphenyl)-propane, resorcinol, pyrogallol, glucinol, 2,4-dihydroxy phenolpropylketone, 2,4-dihydroxy phenyl-N-hexylketone, 2,3,4-trihydroxy phenyl-N-hexylketone, 3,4,5-trihydroxy benzoic ester, bis(2,4-dihydroxy benzoyl) methane, bis (2,3,4-trihydroxy benzoyl) methane, bis (2,4,6-trihydroxy benzoyl) methane, p-bis(2,5-dihydroxy benzoyl) benzene, p-bis(2,3,4-trihydroxy benzoyl) benzene and p-bis(2,4,6-trihydroxy benzoyl), ethyleneglycol di(3,5-dihydroxy benzoate), ethyleneglycol di(3,4,5-trihydroxy benzoate), 1,4-butanediol(3,4,5-trihydroxy benzoate) 1,8-octanediol, di(3,4,5-trihydroxy benzoate),polyethyleneglycol di(polyhydroxy benzoate), and triethyleneglycol di(3,4,5-trihydroxy benzoate).

The vinyl ether compound added to the photoresist composition in accordance with the invention is one having at least one —(CH=CH)—O— group. The vinyl ether group would be bonded to hydrogen if it is a terminal group or bonded to a fragment of an organic compound if the vinyl ether group is a divalent internal group. The vinyl ether compound may have one or more vinyl ether groups and the number of vinyl ether groups does not appear to be critical.

Typical vinyl ether compounds suitable for purposes of the invention include 1,4-cyclohexanol dimethanol divinyl ether, triethylene glycol divinyl ether, propenyl ether of propylene carbonate, 1,1,1-tris(vinyloxymethyl) ethane, hydroxybutyl vinyl ether, aminopropyl vinyl ether, butanediol-1,4 divinyl ether, cyclohexanedimethanol monovinyl ether, cyclohexylvinyl ether, 2-diethylaminoethylvinyl ether, diethylene glycol monovinyl ether, diethylene glycol divinyl ether, ethyl vinyl ether, ethylene glycol butyl vinyl ether, ethylene glycol divinyl ether, ethylene glycol monovinyl ether, hexanediol divinyl ether, hexanediol monovinyl ether, polyethyleneglycol divinyl ether, polytetrahydrofuran divinyl ether, t-amyl vinyl ether, t-butyl vinyl ether, tetraethyleneglycol divinyl ether, triethylene glycol methyl vinyl ether, trimethylolpropane trivinyl ether, vinylisobutyl ether, vinylpropyl ether, vinyl-2-ethylhexyl ether, vinyloctadecyl ether, vinyl ether urethane oligomers, bis(4-vinyl oxybutyl) isophthalate, bis(4-vinyloxymethylcyclohexylmethyl) glutarate, and bis(4-vinyl oxybutyl) succinate.

In addition to the resin binder, PAC and vinyl ether, other components may be contained within the photoresist composition as would be known to those skilled in the art. Typical additives include surfactants, dyes, sensitizers, etc.

The photoresist composition may be applied as a dry film or as a liquid coating composition. When applied as a liquid coating composition, the above components are dissolved in a suitable solvent. Typical solvents are known to those skilled in the art and include, by way of example, Cellosolve acetate, methyl Cellosolve acetate, ethyl Cellosolve acetate, propylene glycol monomethyl ether acetate, methyl tactate, ethyl lactate, 2-ethoxyethyl acetate, methyl pyruvate, ethyl pyruvate, methyl-3-methoxyproprionate, ethyl-3-ethoxyproprionate, N-methyl-2-pyrollidone, cyclohexanone, 2-hexanone, methyl ethyl ketone, 1,4-dioxane, ethylene glycol monoisopropyl ether, diethylene glycol monomethyl ether, diethylene glycol dimethyl ether, etc. When applied as a dry film, a liquid solution of the photoresist composition is applied to a substrate such as Mylar, dried, packaged and applied using heat and pressure at the time of application to a substrate.

For a liquid coating composition, the components of the photoresist are dissolved in one or more of the above solvents. On a dry solids basis, the resin binder comprises a major portion of the photoresist components and typically comprises in excess of 60% by weight of the photoresist composition and preferably varies from about 70 to 95% by weight of the composition. The PAC is conventionally added in a commercially useful photoresist composition in an amount of from about 10 to 25% by weight. Though amounts up to 20% by weight may be used in accordance with the invention, it is an object of the invention to reduce PAC concentration. Accordingly, in accordance with the preferred embodiment of the invention, the PAC concentration varies between about 5 and 17.5% by weight and more preferably, between 7.5 and 12.5% by weight. The vinyl ether component of the resist composition may comprise up to about 20% by weight of the dry components, but preferably varies between about 1% by weight and 15% by weight and more preferably, between about 3% and 10% by weight of the dry components. The weight ratio of the PAC to vinyl ether may be as high as 20 to 1, preferably varies between 10 to 1 and 1 to 2 and most preferably varies between 5 to 1 and 2 to 1.

The components of the photoresists are dissolved in a suitable solvent to make a liquid coating composition or dried on a carrier film to make a dry film photoresist. When dissolved in a solvent, the concentration of total solids in the solvent may vary between 5 and 35 percent by weight and more preferably, between 10 and 25 percent by weight dependent upon the dissolution properties of the solvent used in the photoresist system.

When the photoresist is in the form of a liquid coating composition, the composition is coated onto a substrate using art-recognized procedures such as spin coating, roller coating, doctoring, dipping, etc. Following application of the liquid coating composition to a substrate, the coated substrate is dried to remove solvents. Typical drying conditions comprise baking at a temperature of 75 to 120 degrees C. for from 5 to 10 minutes. Following drying, the dried coating is exposed to activating radiation in a desired image pattern to form a latent image. Thereafter, the coating is typically developed by contact with an alkaline developer.

The photoresists of the invention are used in conventional manner. For example, they may be coated over a printed circuit board substrate in printed circuit manufacture, over a semiconductor wafer for the manufacture of integrated circuits, over a glass substrate for the manufacture of LCD's, or over a metallic substrate for chemical milling applications.

The following examples will better illustrate the invention.

EXAMPLES 1 to 12

The procedure described below was used to process substrates for all examples unless otherwise stated.

The substrate selected for coating was 0.060 double sided copper clad epoxy panels measuring 12 inches by 15 inches. The substrates were prepared by passing the same through International Supplies Scubber, Serial No. 8448. The panel was used shortly after scrubbing. The panels were then coated with liquid coating resist using a No. 15 Myar Rod by placing the rod at the top of a panel to be coated, applying the coating resist on the leading edge of the Myar Rod from a pipette, and drawing the Myar Rod down the panel with a light even pressure at a draw down rate of about 4 inches per second. A 0.3 mm wet thickness coating was obtained using the No. 15 rod for the formulations identified below.

Following coating of the photoresist sample onto the substrate, the substrate coated with the wet photoresist was placed in racks in a convection oven and baked for 10 minutes at 80° C. Following drying of the photoresist, the coated substrate is placed in the center of an exposure frame with the photoresist side facing up. A Stouffer 21 step tablet was placed on a portion of the photoresist with the emulsion side down. Plating tape was coated over another portion of the coating. A vacuum was placed on the exposure frame and the photoresist coating exposed at 25 Kilowatts through the Stouffer tablet at an exposure energy of 100 mJ.

Following exposure, the imaged photoresist coating was developed by immersion of the substrate into 0.23 Normal sodium hydroxide developer maintained at 30° C. The panel was vigorously agitated back and forth in the developer until all of the photoresist was removed from the highest step number of the Stouffer tablet. This is called the breakpoint. Development of the panel is continued for twice the time necessary to reach the break point. The panel was then rinsed for 10 seconds under running water and blown air dry.

Following the above procedure, the step number of the highest step completely free of photoresist was noted and the thickness loss of the exposed resist determined.

The photoresist used in the above procedure had the following base formulation:

| Component | Weight Percent |
| --- | --- |
| Cresylic novolac resin | 30.0 |
| PAC[1] | 10.0 |
| Vinyl Ether[2] | 5.0 |
| Dye | 0.3 |
| Propylene Glycol Monomethyl Ether Acetate | to 1000 ml |

[1]The PAC used was the esterification product of 2,3,4-trihydroxybenzophenone and 1,2-napthoquinone diazide-5-sulfonyl chloride in amounts as set forth in the Table below.
[2]The vinyl ether used is set forth in the following Table.

The results obtained from the above procedure are set forth in the following table:

| Example No. | Vinyl Ether | Break-point (sec) | Step | Thickness Loss uinch |
| --- | --- | --- | --- | --- |
| 1 | Vectomer 2020, a urethane vinyl ether oligomer. | 25 | 5 | 7 |

-continued

| Example No. | Vinyl Ether | Break-point (sec) | Step | Thickness Loss uinch |
|---|---|---|---|---|
| 2 | Vectomer 4020, bis(4-vinyloxy-methylcyclo-hexylmethyl) glutanate | 35 | 2 | −1 |
| 3 | PolyTHF 290, polytetrahydro-furandivinyl ether | 45 | 2 | −2 |
| 4 | Pluriol E200, poly(oxy-1,2-ethane)divinyl ether | 45 | 2 | −7 |
| 5 | Vectomer 4010 SF, bis(4-vinyloxybutyl) isothphalate | 45 | 4 | −9 |
| 6 | Trimethylolpropane trivinyl ether | 30 | 3 | −10 |
| 7 | Cyclohexanedimethanol mono-vinyl ether | 25 | 4 | −10 |
| 8 | Cyclohexyldivinyl ether | 60 | 1 | −10 |
| 9 | Aminopropyl vinyl ether | 35 | 1 | −12 |
| 10 | Tetraethyleneglycol divinyl ether | 45 | 3 | −16 |
| 11 | Vecotmer 4030 SF, bis(4-vinyloxybutyl) succinate | 35 | 4 | −17 |
| 12 | Triethyleneglycol divinyl ether | 23 | 3 | −17 |

For purposes of comparison, the same formulation free of vinyl ether and processed in the same manner would be washed from the substrate during development so that a meaningful resist image could not be obtained. If the vinyl ether component were omitted and the concentration of the PAC increased to 15 percent to compensate for the absence of the vinyl ether, a film formed from the composition would be capable of development, but the film loss would be in excess of 20 microinches. If the vinyl ether were omitted and the PAC content increased to 20 percent, the results obtained would be similar to the results obtained in Example 1.

EXAMPLES 14–25

The following Examples use the same components as used in Example 2 but the concentration of the PAC and the vinyl ether is varied relative to each other. The results obtained are set forth in the following table.

| Example No. | Vinyl Ether Wt. % | PAC Wt. % | Dev. Time Sec. | Step No. | Film Loss % |
|---|---|---|---|---|---|
| 13 | 3 | 7.5 | 36 | 5 | −22.0 |
| 14 | 3 | 10.0 | 25 | 4 | −6.5 |
| 15 | 3 | 12.5 | 22 | 3 | −2.5 |
| 16 | 4 | 7.5 | 52 | 4 | −6.5 |
| 17 | 4 | 10.0 | 35 | 3 | −0.5 |
| 18 | 4 | 12.5 | 30 | 2 | +6.5 |
| 19 | 5 | 7.5 | 99 | 3 | −2.0 |
| 20 | 5 | 10.0 | 53 | 2 | −5.0 |
| 21 | 5 | 12.5 | 47 | 2 | −2.5 |

In example 18, there was an increase in film thickness. It is believed that the increase is due to a mass volume increase due to the reaction between the vinyl ether and the diazo PAC.

We claim:

1. A photoresist coating composition comprising an alkali soluble resin, an o-quinonediazide sulfonic acid ester photoactive compound, a vinyl ether compound, and a solvent for said components, said photoactive compound and said vinyl ether being present in a combined concentration sufficient to form a latent, developable image upon exposure to activating radiation and in a ratio that does not exceed 20 parts photoactive compound to 1 part vinyl ether and is not less than 2 parts photoactive compound to 1 part vinyl ether, and said solvent being present in an amount sufficient to form a liquid coating composition.

2. The composition of claim 1 where the o-quinonediazide sulfonic acid ester photoactive compound is a naphthoquinone diazide sulfonic acid ester.

3. The composition of claim 2 where the vinyl ether is a compound having at least one —(CH=CH)—O— group.

4. The composition of claim 3 where the vinyl ether has two —(CH=CH)—O— groups.

5. The composition of claim 3 where the vinyl ether has three —(CH=CH)—O— groups.

6. The composition of claim 2 where the ratio of the photoactive compound to the vinyl ether does not exceed 10 to 1.

7. The composition of claim 2 where the ratio of the photoactive compound to the vinyl ether varies between 5 to 1 and 2 to 1.

8. The composition of claim 1 where, on a dry solids basis, the photoactive compound comprises from 5 to 25% by weight of the composition.

9. The composition of claim 1 where, on a dry solids basis, the photoactive compound comprises from 5 to 17.5% by weight of the composition.

10. The composition of claim 1 where, on a dry solids basis, the photoactive compound comprises from 7.5 to 12.5% by weight of the composition and the vinyl ether comprises from about 3 to 5 percent of the composition.

11. The composition of claim 1 where the resin is a novolak resin.

12. The composition of claim 1 where the resin is a polyvinyl phenol.

13. A dry film photoresist composition cast from the composition of claim 1.

14. A method for increasing the photospeed of a photoresist comprising an alkali soluble resin and an o-naphthoquinone diazide sulfonic acid ester photoactive compound, said method comprising the steps of replacing a portion of the o-quinonediazide sulfonic acid ester photoactive compound with a vinyl ether compound whereby the ratio of the photoactive compound to the vinyl ether varies between an amount not exceeding 10 to 1 and 2 to 1.

15. The method of claim 14 where the ratio varies between 5 to 1 and 2 to 1.

16. An article of manufacture comprising a substrate coated with the composition of claim 1.

* * * * *